United States Patent [19]

Mizuno et al.

[11] Patent Number: 4,912,065

[45] Date of Patent: Mar. 27, 1990

[54] PLASMA DOPING METHOD

[75] Inventors: Bunji Mizuno, Ikoma; Masafumi Kubota, Osaka; Ichiro Nakayama, Kadoma; Masuo Tanno, Hirakata, all of Japan

[73] Assignee: Matsushita Electric Industrial Co., Ltd., Osaka, Japan

[21] Appl. No.: 198,827

[22] Filed: May 26, 1988

[30] Foreign Application Priority Data

| May 28, 1987 | [JP] | Japan | 62-132464 |
| Jul. 10, 1987 | [JP] | Japan | 62-173209 |
| Aug. 5, 1987 | [JP] | Japan | 62-195911 |
| Feb. 5, 1988 | [JP] | Japan | 63-26088 |

[51] Int. Cl.⁴ ............... H01L 21/22; H01L 21/268
[52] U.S. Cl. ................... 437/141; 437/173; 437/929
[58] Field of Search ............ 437/15, 18, 20, 16, 437/929, 21, 38, 46, 141, 173

[56] References Cited

U.S. PATENT DOCUMENTS

| 3,880,675 | 4/1975 | Tarui et al. | 437/929 |
| 4,382,099 | 5/1983 | Legge et al. | 437/165 |
| 4,434,036 | 2/1984 | Hoerschelmann et al. | 204/164 |
| 4,465,529 | 8/1984 | Arima et al. | 437/929 |
| 4,668,365 | 5/1987 | Foster et al. | 204/192.23 |
| 4,698,104 | 10/1987 | Barker et al. | 437/141 |
| 4,737,379 | 4/1988 | Hudgens et al. | 427/39 |

FOREIGN PATENT DOCUMENTS 61-46044  3/1986  Japan .................... 437/63

Primary Examiner—Olik Chaudhuri
Attorney, Agent, or Firm—Wenderoth, Lind & Ponack

[57] ABSTRACT

Disclosed is a plasma doping method capable of introducing a large quantity of impurities into a substrate at a relatively low temperature (200° to 600° C.). In the LSI fabrication process represented by Si process, it is necessary to introduce impurities at a properly controlled concentration into desired positions. In this plasma doping method, in order to satisfy this application, the doping temperature may be controlled around 100° C. at high degree of vacuum and by ECR discharge or the like, and a process capable of using a resist mask generally used in the LSI fabrication step and controlling the concentration in a wide range is enabled, so that an extremely shallow impurity profile is realized.

5 Claims, 5 Drawing Sheets

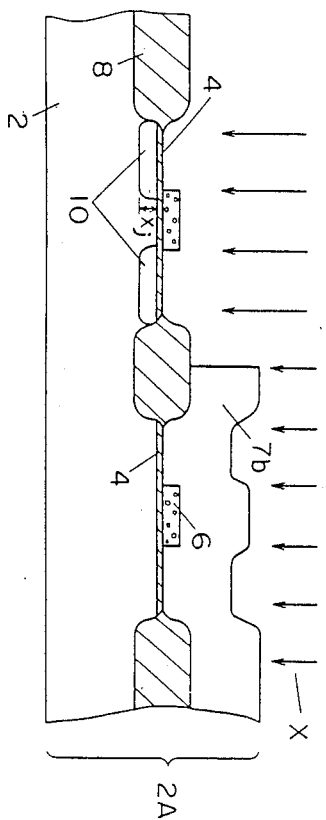
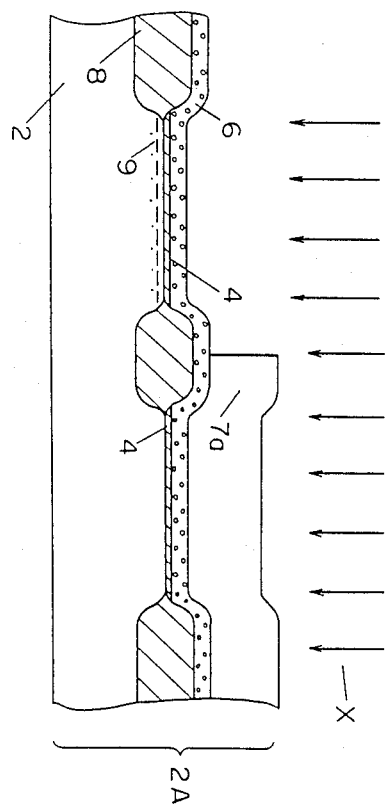
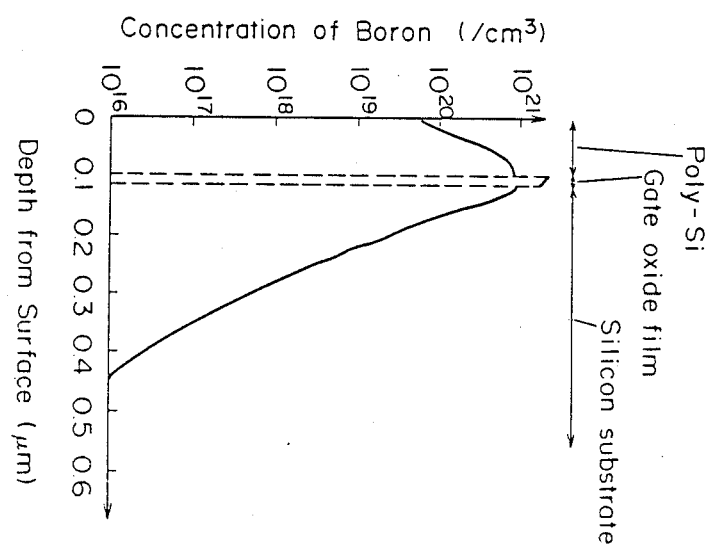

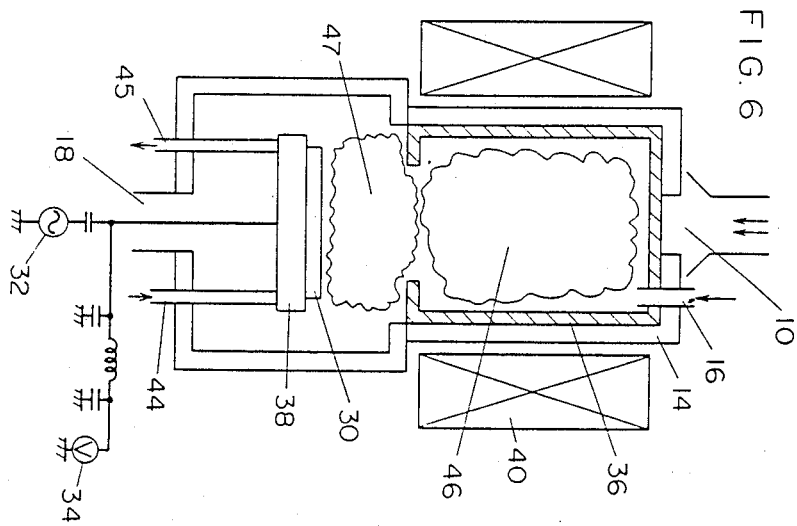
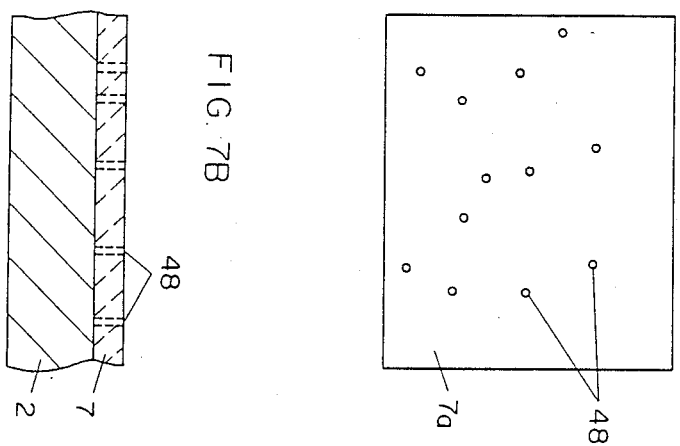
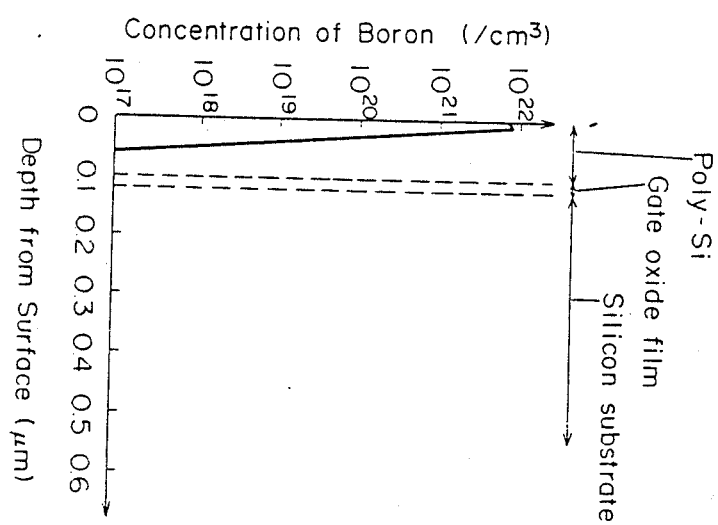

PLASMA DOPING METHOD

BACKGROUND OF THE INVENTION

This invention relates to plasma doping method, and more particularly to an impurity doping method by irradiating the surface of a sample with plasma to dope the impurity into the sample.

In a silicon integrated circuit manufacturing process, processes of doping acceptor impurities such as boron, and donor impurities such as arsenic and phosphor are repeatedly necessary. For this purpose, it is general to transform impurities into ions, and to implant the ions by accelerating them in a range from tens of kV to several kV, but for doping into polycrystalline silicon to be used in a gate of a MOS transistor or the like, diffusion from phosphorus glass, arsenic glass or boron glass, etc. is generally employed. This is because the ion implantation is poor in throughput and too high in cost because the doping quantity into polycrystalline silicon is extremely large. The method of using phosphorus glass requires three steps of (1) deposition of glass, (2) heat treatment, and (3) removal of glass, and, moreover, since phosphorus glass deposits on an entire surface of a silicon substrate, it is hard to dope locally in a certain region. On the other hand, as gate material of CMOS LSI, n+polycrystalline silicon has been conventionally used, but as channel length is shortened, it comes t be necessary to use n+polycrystalline silicon at a n-channel side and p+polycrystalline silicon at a p-channel side from the aspect of control of channel threshold voltage.

To fabricate n-type and p-type polysilicon gates into one chip, in prior art, ion implantation technique must be used. FIG. 1A is a diagram to explain formation of, for example, p-type polysilicon gate. On a polysilicon film 6 formed on a gate oxide film 4 on a silicon substrate 2, boron ions are implanted as indicated by arrow X with an energy of about tens of keV. In order to implant only into the p-type region, a resist 7a is selectively opened. Numeral 8 denotes a peripheral oxide film. In order to form an n-type polysilicon gate, ions of phosphor or arsenic are implanted into the polysilicon film 6.

This method is effective as far as the gate oxide film is thick and the polysilicon film is also thick, but it is no longer applicable the transistor size is reduced, the gate oxide film becomes thin, and the polysilicon film also becomes thin in the trend of higher density and higher performance. That is, in FIG. 1A, implanted ions penetrate through the gate oxide film 4 and, a layer 9 is formed beneath it. FIG. 2 is a diagram to show concentration distribution (simulation) from the boron surface when boron ions of $1 \times 10^{16}$ /cm$^2$ are implanted at an acceleration energy of 10 keV in the case of gate oxide film thickness of 13 nm and polysilicon film 6 thickness of 0.1 $\mu$m above it. In an ordinary ion implantation of 10 keV, in spite of the lowest energy, it is known that boron has invaded up to the silicons substrate by penetrating through the gate oxide film 4. Such penetration of boron into the silicon substrate is not acceptable because the threshold voltage of the MOS transistor is varied. Besides, as shown in FIG. 1B, generally in forming source and drain electrode region 10, it is necessary to dope the impurities of high concentration locally respectively by dividing into the p-type region and n-type region, and it is forced to use an expensive ion implantation machine. However, in the source and drain electrodes, too, smaller depth of junction $x_j$ is required as transistor size is reduced. As described previously, especially in p-channel MOS, since boron ions of relatively light weight are used, the depth of junction reaches as much as 0.3 $\mu$m as shown in FIG. 2 earlier even if implanted at the lowest energy of 10 keV in the existing ion implantation machine. To solve this problem, molecule ions such as BF$^+_2$ ions are used, but fluorine impurity forms defects at interface between silicon and oxide film, metal silicide film, etc.

It hence gives rise to necessity of a method of doping locally and at low cost.

As a method which satisfies such need, a plasma doping device is known (disclose, for example, in Monthly Semiconductor World, p. 158, 1882, Vol. 2, in Japanese). A conventional plasma doping device is explained by referring to FIG. 3. Inside a grounded vacuum chamber 14, a gas containing doping impurities, such as diborane (B$_2$H$_6$) and arsine (AsH$_3$), is introduced through a gas inlet 16, and is discharged from an exhaust port 18 by a vacuum exhaust device (not shown), so that the internal pressure is kept between one to several Torr. A metallic sample table 20 placed in the chamber 14 is connected to a DC power source 22, and a silicon substrate (wafer) 2A is put in the sample table 20. When a DC voltage of several hundred volts is applied to the sample table 20 through DC power source 22, the gas in the chamber 14 is transformed into plasma by glow discharge, and the impurity ions to be doped are accelerated by the electric field in an ion sheath 26 formed around the sample table 20 and wafer 2A working as the cathodes, and are doped into the wafer 2A. Generally, the wafer 2A is heated to 200° to 300° C. because it is directly exposed to plasma, but at the degree of vacuum in the DC or RF discharge region ($10^{-2}$ Torr or less), if the substrate is at low temperature, such as about 200° C., a thin film of the impurities to be doped is deposited on the wafer surface, and hence the substrate is further heated by a heater 28 embedded in the sample table 20.

Such device is partly applied in the silicon integrated circuit manufacturing process when doping impurities at high concentration from contact holes in order to reduce the contact resistance between the aluminum electrode and silicon diffusion layer after contact hole forming process.

When doping impurities by using a material withstanding high temperature of oxide film such as a contact hole as mask, such conventional plasma doping device is effective because it is possible to dope locally at low cost, but when it was necessary to use a photoresist as mask, the wafer temperature became too high and it was not appropriate. For example, when using both p+polycrystalline silicon and n+polycrystalline silicon as the gate material for enhancing the performance of CMOS LSI, only the regions to dope are opened by using a resist in order to keep the number of process at minimum, and p-type impurity and n-type impurity are injected into the non-dope polycrystalline silicon at a high concentration of over 10$^{16}$/cm$^2$, but in the conventional plasma doping device, since the operation exceeds the heat resistance limit (about 200° C.) of the photoresist, it was forced to use an expensive ion implantation device for a long time.

Incidentally, in a vacuum range of $7.5 \times 10^{31}$ $^4$ to $7.5 \times 10^{31}$ $^1$ Torr, a method of generating plasma at high density despite high degree of vacuum by applying a magnetic field in the direction along the surface of substrate is known (Japanese Laid-Open Pat. No. 6126219). In this method, however, since the closest part of the substrate is exposed to plasma of highest density, the substrate temperature is elevated in an extremely short time, instantly exceeding the heat resistance limit of the resist. Although it is possible to dope in this short time, it is hard to control the concentration of the impurity to be doped. That is, since start of discharge is often unstable, it is better to take enough time in order to achieve high reproducibility of concentration control. Besides, since the plasma density is a high concentration, if it is attempted to form a doped layer of a properly low concentration, the doping time must be shortened extremely, for example, within 1 second. As its countermeasure, it is necessary to dilute the material gas (e.g. $B_2H_6$, $PH_3$, $AsH_3$) with base gas (He, $H_2$, etc.), and dope in a sufficient time, and hence it is difficult to dope at high reproducibility and excellent concentration control, while keeping above the heat resistance limit of the resist.

In the explanation about this method, meanwhile, nothing is mentioned about the process of using the resist as the mask.

SUMMARY OF THE INVENTION

It is hence a primary object of this invention to present a plasma doping method capable of solving the above-discussed conventional problems.

It is another object of this invention to present a plasma doping method capable of solving the abovediscussed conventional problems.

It is another object of this invention to present a plasma doping method which has eliminating damages on the resist by controlling the degree of vacuum in the chamber above $5 \times 10^{-2}$ Torr, or more preferably $5 \times 10^{-3}$ Torr or more, when doping plasma. Besides, because of doping at high degree of vacuum, it is possible to cool the substrate in water, and this invention also presents a plasma doping method capable of doping impurities at high concentration in a short time while keeping the sample temperature beneath the degeneration temperature of the resist. Furthermore, since the ions in plasma are of low energy, impurities can be doped into a thin film of fractions of a micrometer in thickness, and a shallow junction can be formed on the substrate. In addition, since the resist can be used as the mask as mentioned above, this is a simple and inexpensive method of doping impurities locally in a shallow profile.

While the novel features of the invention are set forth in the appended claims, the invention, both as to organization and content, will be better understood and appreciated, along with other objects and features thereof, from the following detailed description taken in conjunction with the drawings.

BRIEF DESCRIPTION OF THE DRAWINGS

FIG. 1A, FIG. 1B are schematic sectional views showing conventional LSI fabricating processes;

FIG. 2 is a diagram to show the characteristics of boron concentration distribution in Si and $SiO_2$ in the prior art;

FIG. 4 and FIG. 6 show the construction of a plasma doping device to be used in the plasma doping method according to embodiments of this invention;

FIG. 7A is a plan view showing the state of injury on the resist when executing the embodiment, ad FIG. 7B is its sectional view;

FIG. 8 is a diagram to show the characteristics of boron concentration distribution in Si and $SiO_2$ in the embodiment.

DETAILED DESCRIPTION OF THE INVENTION (Embodiment 1)

Figure 3:
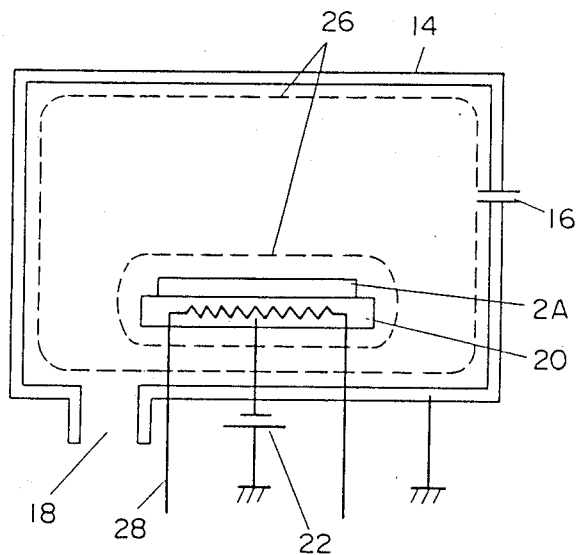
FIG. 3 shows the construction of the device used in the conventional LSI fabricating process.
Figure 4:
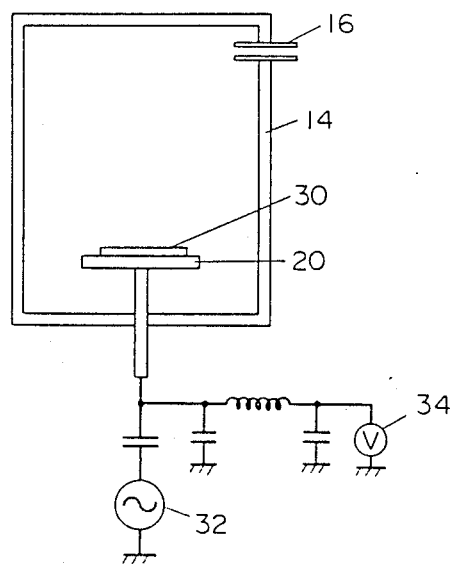

Referring now to the drawings, a plasma doping method according to a first embodiment of this invention is explained below. In FIG. 4, numeral 14 is a vacuum chamber, 20 is an electrode (sample table), and 30 is a substrate. Numeral 16 is a gas inlet, 32 is a high frequency power source of i.e. 13.56 MHz, and 34 is a voltmeter for measuring cathode dorp voltage (abbreviated Vdc hereinafter).

Figure 5A:
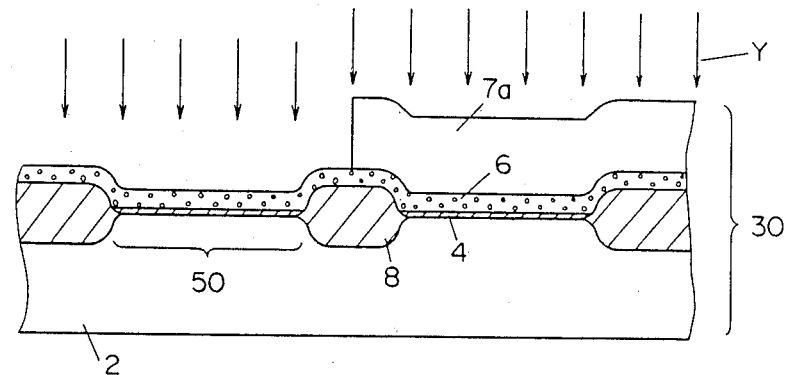
FIG. 5A to FIG. 5C are schematic sectional views showing the LSI fabricating processes according to the embodiment.
Figure 5B:
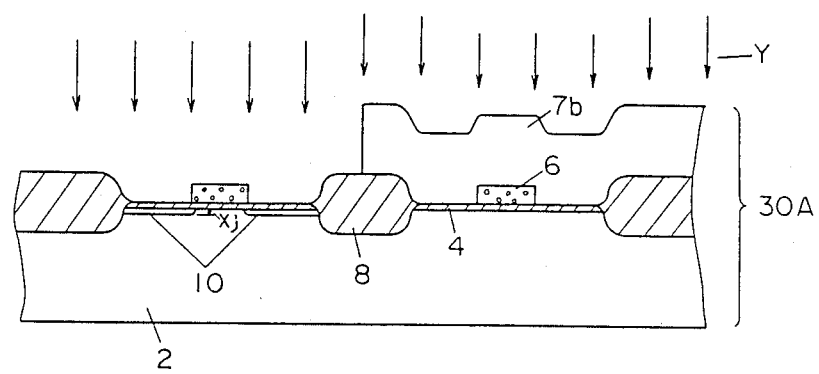
Figure 5C:
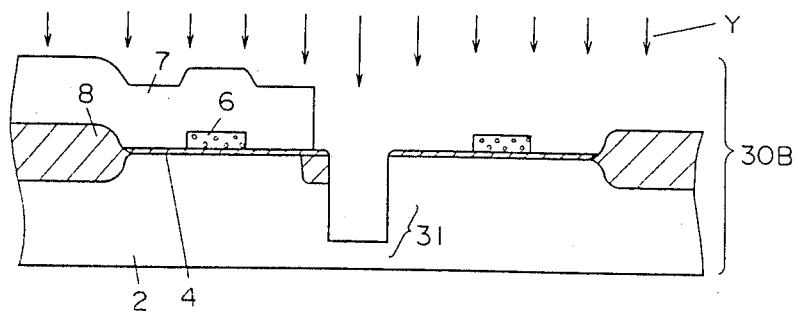

FIG. 5A is a structural sectional view of the substrate 30 to be doped, and FIG. 5B is a structural sectional view of a substrate 30A containing a CMOS transistor slightly differing in structure. The structure of the substrate is same as that explained in FIG. 1. In the drawing, Y denotes ions in the plasma. Incidentally, this substrate may also contain a trench 31 (30B) as shown in FIG. 5C.

Its operation is explained by referring to FIG. 4. As the impurity gas to be doped into the substrate 30, $B_2H_6$ (He base 5%) was used, and injected into the vacuum chamber 14 at 10 sccm through the gas inlet 16. The inside of the vacuum chamber was kept at a degree of vacuum of $2 \times 10^{-3}$ Torr, and an electric power was supplied form the high frequency power source 32 so that the Vdc meter 34 indicates $-700V$, for 100 seconds, and doping was effected.

When a similar experiment was conducted at $2 \times 10^{-2}$ Torr, existence of boron in the order of $10^{21} cm^{-3}$ was similarly recognized, but when doped at a higher degree of vacuum of over $5 \times 10^{-2}$ Torr, a boron film began to be formed on the surface of the substrate 30, and it was found that the concentration control became difficult. In this region, too, it was confirmed that the resist 7 was degenerated. To the contrary, at $1 \times 10^{-3}$ Torr or less, plasma generation was difficult, and doping was impossible.

Incidentally, when doping n-type impurities, $AsH_3$, $PH_3$, or a similar gas may be used.

(Embodiment 2)

FIG. 6 is a schematic sectional view of a device used in an embodiment of this invention, in which numeral 14 is a vacuum chamber, 36 is a quartz chamber, 16 is a doping gas inlet, 18 is an exhaust port, 38 is a sample table with cooling mechanism, on which a substrate 30, 30A or 30B explained in FIG. 5 is a placed, 40 is a coil for generating a magnetic field, 42 is a microwave inlet, 44 is a cooling water into sample cooling mechanism, and 45 is a cooling water outlet. When doping boron, a gas containing boron, for example, diborane $B_2H_6$ is introduced into the chamber 14 through the gas inlet 16. The inside of the plasma generating chamber 14 is made of quartz, which contributes to prevention of contamination of sample due to spattering of chamber side wall, and also to minimization of elimination of plasma and radicals on the wall surface. The inside of the chamber 14 is kept at a degree of vacuum of $5 \times 10^{-3}$ Torr or more by controlling the opening angle of the conductance valve to the exhaust system communicating with the exhaust port 18 and the flow rate of $B_2H_6$. At frequency of 2.45 GHz, microwaves of tens to hundreds watts are introduced from the inlet 42, and the magnetic field created by the coil 40 (max. approx. 900 Gauss) and electrons in the plasma produce a state close to an electron cyclotron resonance (ECR), and a plasma of relatively high density is produced in spite of high degree of vacuum. The sample table 38 is cooled by the circulating water cooled from 0° C. to about 30° C. For cooling the sample table 38, superpurified water high in insulation or other liquid high in insulation is used, and by applying the electron cooling or a method of cooling by blowing He to the back side of substrate 30, etc., or other method, it is possible to apply a DC or RF bias to the sample table 38 and form a discharge region 47 in the space against the substrate. Thus, the potential energy between plasma and sample table can be set freely.

Plasma doping was conducted by using this device. An example of doping boron by using, for example, n-type Si as semiconductor substrate is illustrated below. As impurity gas, $B_2H_6$ is diluted with He to, for instance, 5%, and it is introduced into the chamber by 6 sccm, and by adjusting the conductance valve, the degree of vacuum is kept at, for example, $5 \times 10^{-4}$ Torr. By generating plasma in ECR condition, Rf discharge is effected between this plasma and substrate 30 or the like, keeping the state so that the Vdc meter 34 registers at $-700V$. When exposed to plasma for 100 seconds in this state, the photoresist was free from damage, and the opening free from resist 7 was doped with boron at the surface concentration of about $10^{22}$ cm$^{-3}$ and depth of 50 nm, as being confirmed by the secondary ion mass spectroscopy (SIMS) analyzing method. In this case, the resist 7 must be baked after coating and development processes, and at the degree of vacuum of about $1 \times 10^{-3}$ Torr or higher, baking at 150° C. or higher is needed, and if somewhere between $5 \times 10^{-3}$ and $1 \times 10^{-3}$, surface curing by far ultraviolet ray irradiation at wavelength of 200 to 300 nm should be needed.

FIG. 7 shows the photoresist 7 and its surface 7a when the degree of vacuum was controlled under $5 \times 10^{-3}$ Torr by closing the conductance valve. Numerous tiny holes 48 are observed, and function as resist is lost.

Anyway, in both embodiments 1 and 2, unless the density of plasma is sufficiently low, the temperature of the wafer surface goes up to exceed the heat resistance limit of the resist. For example, when both ECR and RF discharge are conducted at a pressure higher than $5 \times 10^{-3}$ Torr, the plasma density elevates, and the energy application on the wafer surface increases, thereby causing the wafer temperature to exceed the heat resistance limit of the resist.

(Embodiment 3)

This is to explain an example of doping borons on Si substrates containing MOS structure and trench shape as explained in FIG. 5, by using the device described in embodiment 2. The substrate 30 is put on the sample table 38 in FIG. 6. As shown in FIG. 5, on this substrate 30, after sequentially passing through the C-MOS transistor forming processes, a gate oxide film 4 (for example 13 nm) and polysilicon film 6 for gate electrode (for example, 0.1 $\mu$m) are laminated on an active region 50 separated from a peripheral oxide film 8, and it is selectively opened by resist 7a. In this case, because of boron doping, the p-MOS region is opened.

FIG. 8 shows the results of SIMS analysis of concentration distribution of boron from the surface when a structure with gate oxide film 13 nm and polysilicon 6 film thickness of 0.1 $\mu$m (for example, substrate structure 30 shown in FIG. 5A) is exposed to gas plasma of diborane ($B_2H_6$), instead of ion implantation. The boron remained within the range of 50 nm depth from the surface in the polysilicon, not reaching up to the gate oxide film 4. Therefore, the penetration layer 9 in FIG. 1 as seen in ion implantation is never formed. As a result, the threshold voltage does not fluctuate.

After depositing about 300 nm of tungsten silicide film (not show)) by sputtering method on this boron-doped polysilicon film 6 and forming pattern, heat treatment was conducted for 20 minutes at 900° C. in nitrogen atmosphere. Thus formed MOS transistor was good in the reproducibility of threshold voltage, and presented excellent characteristics.

Meanwhile, to realize 30B, an example of doping by plasma, without ion implantation, both source and drain electrodes 10, after patterning gate polysilicon electrode 6 is described while referring to FIG. 5B. After patterning the gate electrode 6 by dry etching method, and pMOS region and nMOS region are selectively opened by resist 7b. In this case, to dope boron, pMOS region is opened. In this state, while cooling the sample table 38 in FIG. 6, doping is conducted in the condition same as in embodiment 2. In FIG. 5B, numeral 8 is a peripheral oxide film for separation. When doped in this condition, the substrate temperature does not exceed the heat resistance limit of the resits 7b, and even while cooling the substrate, thin film of impurities does not deposit on the surface, and it is possible to keep at a temperature where diffusion of impurities can be ignored (in this case, actually 200° C. or less), so that a dope layer of an extremely shallow (within 50 nm) profile is formed as shown in the SIMS profile in FIG. 8. This dimension is applicable if the gate length is 0.25 $\mu$m or less. Furthermore, when doping into source and drain in a separate process from doping into gate electrode, as shown in FIGS. 5A, 5B, 8, impurities will not penetrate beneath the gate even in a polysilicon film of 0.1 $\mu$m or less, and asperities may be minimized structurally, and which makes easier the process of flattening which is important in the fabrication process of LSI.

Figure 9:
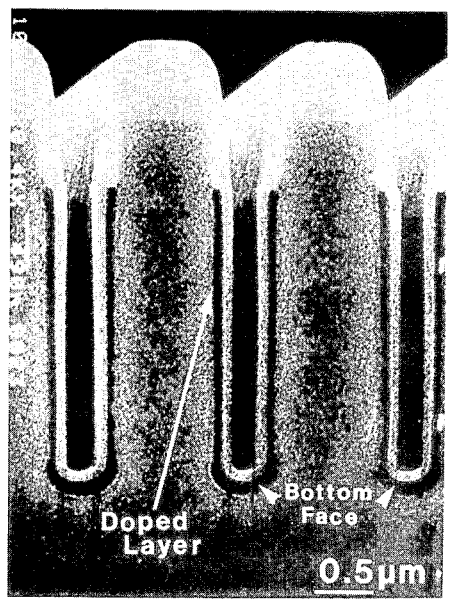
FIG. 9 is an SEM picture showing the trench structure formed by the embodiment.

FIG. 9 is a picture showing the mode of doping when a trench of 0.45 $\mu$m in width and 2.8 $\mu$m in depth is formed on a silicon wafer. This is a micrograph of the trench section by scanning electron microscope (SEM). The dark contrast portion around the trench is the high-concentration boron doped layer. This specimen is selectively etched for the ease of observation. Such trench is mainly used in a DRAM of 4 megabits or greater, and according to the method shown in embodiment 2, impurities can be doped even into the perpendicular side wall of the trench having a high aspect ratio as show in FIG. 9. At this time, needless to say, the resist can be used as mask. When using the resist, this process consists of only three steps: 1. lithography, 2. doping, and 3. removal of resist. But when the resist cannot be used because of high process temperature the process is twice as complicated: 1. deposition of heat resistance material, 2. lithography, 3. selective etching of heat resistant material, 4. removal of resist, 5. doping, and 6. selective etching of heat resistant material. Still more, the selective etching of heat resistant material in steps 3 and 6 is extremely difficult. Moreover, when a trench is contained in the substrate, the number of steps increases three or four times as much.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

We claim:

1. A process of plasma doping a substrate comprising the steps of:
    (a) providing an apparatus possessing a mechanism capable of applying microwave and magnetic field satisfying the electron cyclotron resonance condition, in a vacuum chamber;
    (b) placing a substrate coated by a resist having an opening on a sample table disposed in said vacuum chamber;
    (c) generating plasma by introducing a gas containing a specific element into said vacuum chamber, said plasma being generated in said vacuum chamber at a vacuum higher than $5 \times 10^{-3}$ Torr;
    (d) generating a discharge between said vacuum chamber and said substrate by applying high frequency or direct-current electric power to said sample table; and
    (e) doping said substrate with an impurity containing said specific element in said plasma, with said resist being left over on said substrate, by making use of the potential difference produced between said substrate and said plasma, and wherein said substrate and said sample table are cooled during the plasma doping process.

2. A process of plasma doping a substrate according to claim 1, wherein a semiconductor substrate is used as the substrate to be doped.

3. A process of plasma doping substrate according to claim 2, wherein a silicon substrate is used as the substrate to be doped.

4. A process of plasma doping a substrate according to claim 1, wherein a semiconductor substrate is used as the substrate to be doped, and a substrate containing a structure composed of an insulation film formed on this semiconductor substrate and a semiconductor thin film on said insulating film is used.

5. A process of plasma doping a substrate according to claim 4, wherein silicon is used as the semiconductor substrate to be doped, a gate insulation film is formed on this silicon substrate, and the silicon substrate containing a structure having a gate electrode film deposited on said insulation film, and part of plural positions of said silicon substrate opened in the vicinity of said structure is used.

* * * * *